United States Patent [19]

Ipposhi et al.

[11] Patent Number: 5,214,001
[45] Date of Patent: May 25, 1993

[54] METHOD OF MANUFACTURING SEMICONDUCTOR DEVICE HAVING PLANAR SINGLE CRYSTAL SEMICONDUCTOR SURFACE

[75] Inventors: Takashi Ipposhi; Kazuyuki Sugahara, both of Hyogo, Japan

[73] Assignee: Mitsubishi Denki Kabushiki Kaisha, Tokyo, Japan

[21] Appl. No.: 640,499

[22] Filed: Jan. 14, 1991

[30] Foreign Application Priority Data

Jan. 18, 1990 [JP] Japan .................. 2-010852

[51] Int. Cl.⁵ ............... H01L 21/302; H01L 21/463
[52] U.S. Cl. ...................................... 437/228; 437/8; 156/636; 156/637; 156/645; 156/626
[58] Field of Search ............ 437/228, 225, 974, 946; 156/643, 645

[56] References Cited

U.S. PATENT DOCUMENTS

| | | | |
|---|---|---|---|
| 4,631,804 | 12/1986 | Roy | 439/228 |
| 4,879,258 | 11/1989 | Fisher | 437/974 |
| 4,933,298 | 6/1990 | Hasegawa | 437/228 |
| 4,962,064 | 10/1990 | Haskell et al. | 437/228 |

FOREIGN PATENT DOCUMENTS

63-266830 11/1988 Japan ...................... 437/228
64-11331 1/1989 Japan .

*Primary Examiner*—Olik Chaudhuri
*Assistant Examiner*—H. Jey Tsia
*Attorney, Agent, or Firm*—Lowe, Price, LeBlanc & Becker

[57] ABSTRACT

A manufacturing method of a semiconductor device having a planar single crystal semiconductor surface is disclosed. In the manufacturing method of a semiconductor device, an insulating film is formed on a semiconductor substrate, a noncrystal semiconductor film is formed on the insulating film, a stripe-like anti-reflection film is formed on the noncrystal semiconductor film, and laser beam is irradiated along the anti-reflection film. Because of the difference in temperature, a film with thicknesses different in a substrate region in which the anti-reflection film is formed and a region around it is formed. A film to be a machining allowance for polishing is formed on the single crystal semiconductor film, polishing is performed from the side of said film to be a machining allowance for polishing so that desired planar film thickness of the single crystal semiconductor film is implemented.

16 Claims, 6 Drawing Sheets

METHOD OF MANUFACTURING SEMICONDUCTOR DEVICE HAVING PLANAR SINGLE CRYSTAL SEMICONDUCTOR SURFACE

BACKGROUND OF THE INVENTION

1. Field of the Invention

The present invention relates to a method of manufacturing a semiconductor device, and more particularly, to a method of manufacturing a semiconductor device having a planar single crystal semiconductor film surface on an insulator.

2. Description of the Background Art

As a technique for forming a single crystal semiconductor layer on an insulator, SIMOX (Separation by Implanted Oxygen) is known. SIMOX is a method of obtaining a structure, in which oxygen ions are implanted into a single crystal semiconductor substrate to form an embedded insulator so that mutually separated semiconductor layers are formed.

As another technique for forming a single crystal semiconductor layer on an insulator, a melting recrystallization method is known. In this method, a non crystal semiconductor on an insulating film is heated and melted by a heater or is exposed to and melted by energy beam.

Among above-described techniques, the melting recrystallization method by energy beam irradiation has received much attention as a means for implementing a three dimensional element. Here, "the three dimensional element" has multiple integrated circuit layers with insulating layers disposed therebetween, and intended to realize greatly improved functions and a very high degree of integration as compared with a conventional two dimensional element which has been a single integrated circuit.

While the known energy beam for use in the melting recrystallization method includes large output laser or electronic beam, the method using laser is more applicable to forming a single crystal semiconductor layer on an insulator because it can be easily operated. To form a single crystal semiconductor layer using the melting recrystallization method by laser irradiation, it is necessary to control temperature distribution in the melted semiconductor to begin the recrystallization at a predetermined portion. One of such temperature distribution controlling methods is the anti-reflection film method.

Figure 5A:
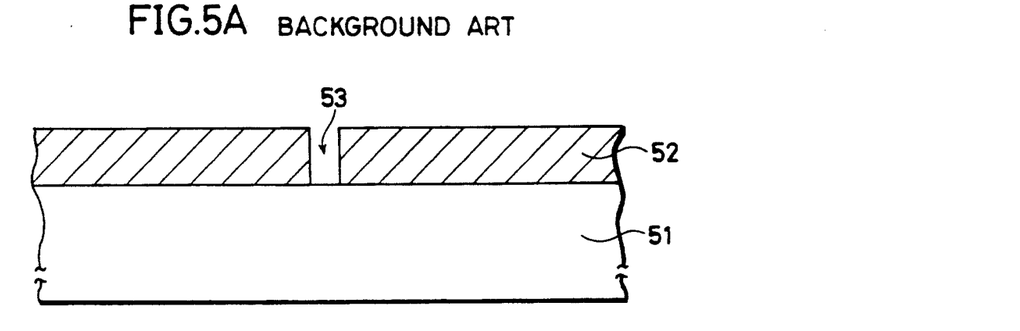
FIGS. 5A-5D are sectional views showing in the sequence of steps a semiconductor device manufacturing method employing a melting recrystallization method which is applied to one embodiment of this invention and is the background of this invention.

Next, the melting recrystallization method using laser beam and utilizing the anti-reflection film method will be briefly described. Referring to FIG. 5A, an insulating film 52 is formed on a semiconductor single crystal substrate 51 made of silicon, for example. Next, an opening portion 53 is provided to be a seed portion at a predetermined portion of the insulating film 52.

Figure 5B:
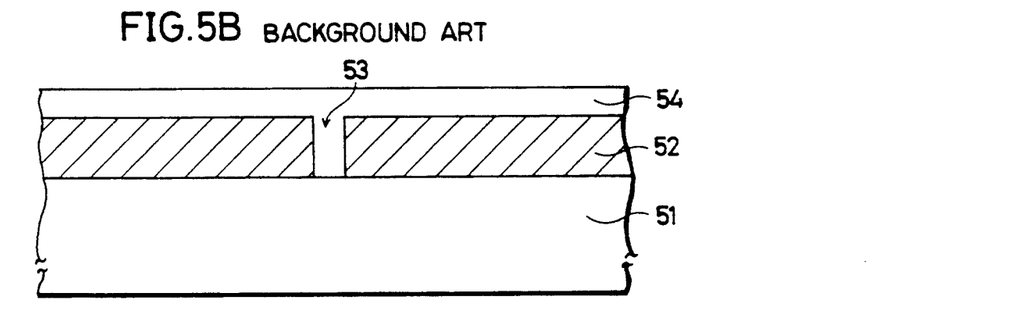
Figure 5C:
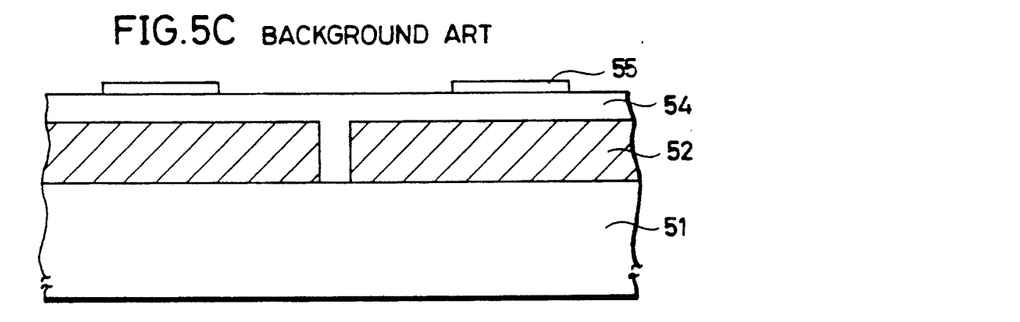

Next, referring to FIG. 5B, a polysilicon film 54 is formed on the insulating film 52 by the CVD (Chemical Vapor Deposition) method. The opening 53 is then filled with the polysilicon film 54. Next, referring to FIG. 5C, an anti-reflection film 55 formed of silicon nitride film is formed by the CVD method on the polysilicon film 54, and patterned to be a predetermined form.

Figure 6:
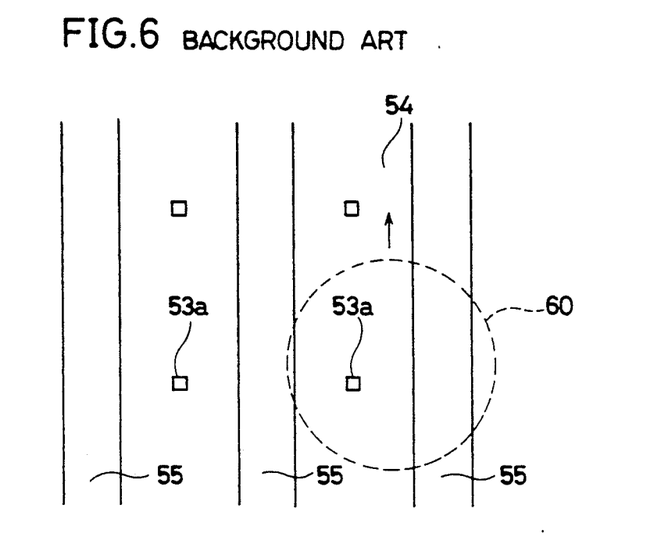
FIG. 6 is a reduced plan view of a semiconductor device shown in FIG. 5C showing the laser beam scanning.

Referring to FIG. 6, the anti-reflection films 55 are provided like stripes at predetermined intervals. The laser beam 60 is irradiated onto the polysilicon film 54 and the anti-reflection films 55. The laser beam 60 is then scanned in the direction shown with the arrow in FIG. 6 along the longitudinal direction of the anti-reflection films 55, for example.

Figure 5D:
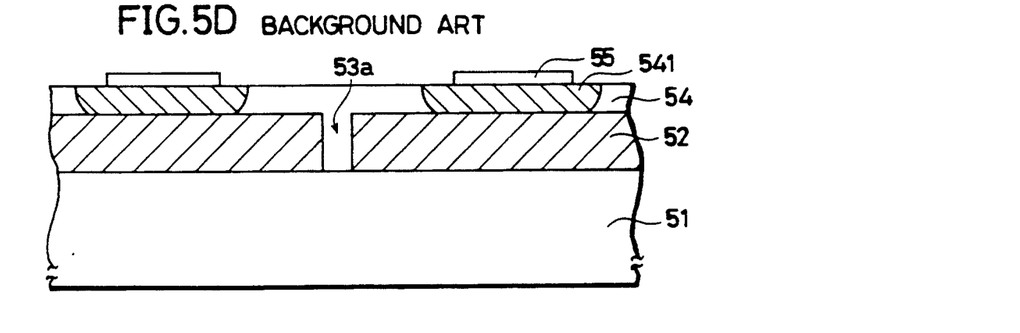

Referring to FIG. 5D, because the laser beam is absorbed more into a portion under the anti-reflection film 55 than a portion without anti-reflection film, the temperature therein is higher. Therefore, the region 541 where the silicon is melted extends from the region under the anti-reflection film 55 toward a portion at which the seed portion 53a is to be provided. As semiconductor layers melted by laser irradiation solifies starting at portions at lower temperature, the recrystallization always begins at portions between the anti-reflection films, and the portions under the anti-reflection films 55 solidify at the end, because the portions under the anti-reflection films 55 have higher temperature. With respect to the thermal conductivity, as a crystal semiconductor has the biggest value, the heat in solidification diffuses mainly toward the crystal semiconductor. As a result, when the seed portion 53a is provided between the anti-reflection films 55, the recrystallization always begins at the seed portion, and epitaxial growth having a seed of the single crystal semiconductor substrate 51 is produced. Thus, a single crystal semiconductor film having the same crystal orientation as that of the single crystal semiconductor 51 as a substrate is obtained on an insulator 52.

Figure 7:
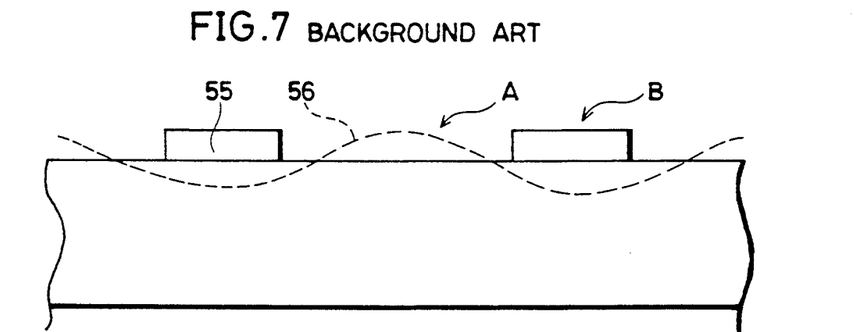
FIG. 7 is a schematic diagram showing a surface condition of a single crystal semiconductor film obtained by the semiconductor device manufacturing method which is the background of this invention shown in FIGS. 5A-5D.

When such a single crystal semiconductor film is formed, the region between the anti-reflection films solidifies first and the region under the anti-reflection film solidifies later, since the layer under the anti-reflection film has a temperature higher than that of the region between the anti-reflection films. The higher the temperature of the melt is, the lower the surface tension is. Accordingly, a previously solidifying portion A forms a convex and a later solidifying portion B forms a concave in the single crystal semiconductor as shown by the broken line in FIG. 7. Therefore, the surface of the single crystal semiconductor film 56 has irregularity corresponding to the anti-reflection films 55 as shown in FIG. 7. As the width of the anti-reflection film 55 is about 5 μm and the distance between the anti-reflection films is about 10 μm, the convex or concave exists about every 15 μm.

Figure 8:
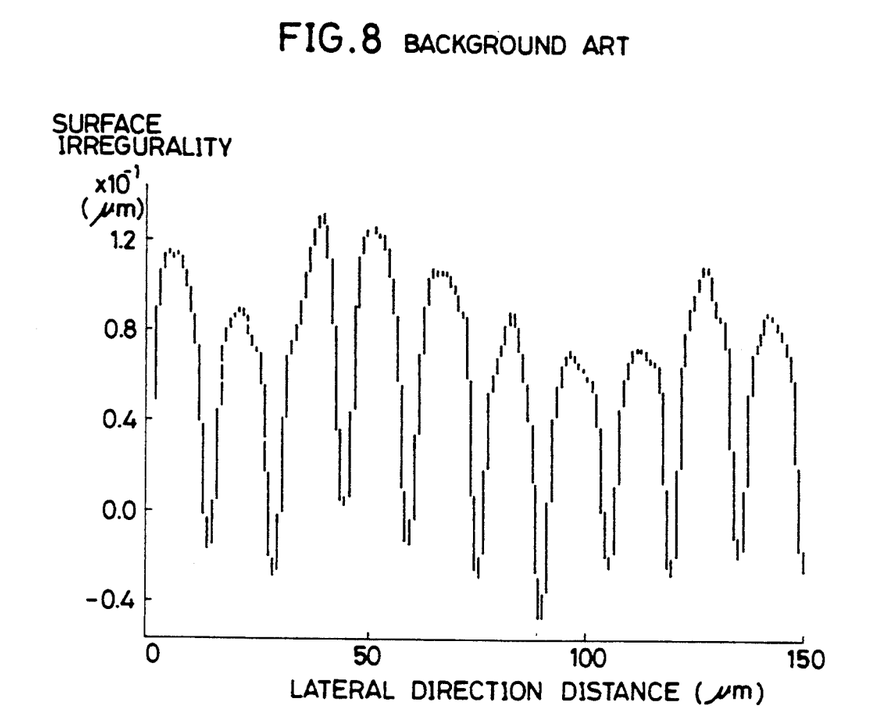
FIG. 8 is a graph showing the actually measured surface convexes and concaves of the single crystal semiconductor film obtained by the semiconductor device manufacturing method which is the background of this invention shown in FIGS. 5A-5D.
Figure 9:
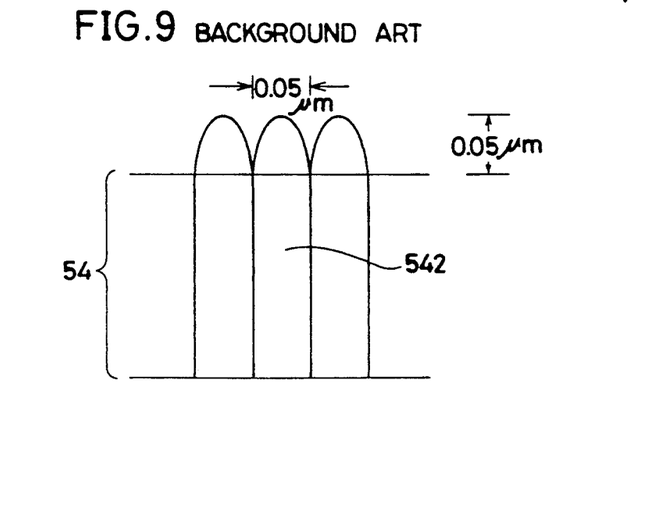
FIG. 9 is a schematic view showing surface irregularity corresponding to the grain appearing in the semiconductor device manufacturing method which is the background of this invention.

An actual measurement example of a surface irregularity of a single crystal semiconductor film formed in this way is shown in FIG. 8. In FIG. 8, the axis of abscissa denotes a distance in a direction vertical to the direction of extention of the anti-reflection film. The measurement has been performed in case where the thickness of the recrystallized semiconductor film on an insulating film is 0.55 μm. FIG. 8 shows that the magnitude of the irregularity on the surface of the semiconductor film is about more than ±0.06 μm. Furthermore, even immediately after forming a noncrystal or polycrystal film before recrystallization, there are convexes and concaves corresponding to the silicon grain 542 on the surface of the noncrystal or polycrystal film 54 as shown in FIG. 9. Such irregularity on the surface causes inconvenience in the various processes in device manufacturing and lack of uniformity in device performance. Although it is known that the device performance advances if the thickness of the semiconductor film is 0.1 μm or less when a semiconductor element is formed in a semiconductor film on an insulating film, it is difficult to obtain a planar thin film even by etch back method which is common as planarization technology because of the above-described surface irregularity.

Figure 10:
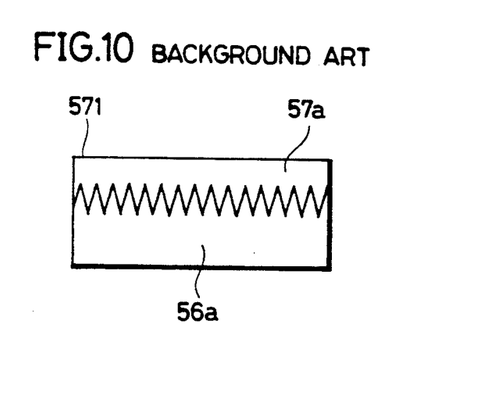
FIG. 10 is a section view showing etch back method which is the background of this invention, wherein fine convexes and concaves exist on the semiconductor film to be etched.
Figure 11:
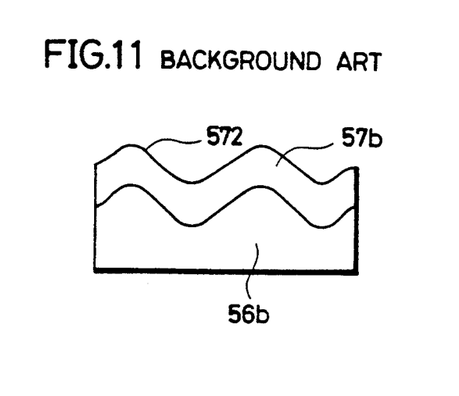
FIG. 11 is a section view showing etch back method which is the background of this invention, wherein convexes and concaves of long cycle exist on the semiconductor film to be etched.

The reasons of the difficulty in thinning a film will be described below referring to FIG. 10. When the irregularity on the semiconductor film 56a is very small, it is possible to form a planar resist film 57a on the semiconductor film 56a. Accordingly, when etching is performed using the planar surface 571 as a reference plane, as long as the etching rate of the semiconductor film 56a is equal to that of the resist film 57a, a planar and thin semiconductor film can be obtained. On the other hand, referring to FIG. 11, when the irregularity on the semiconductor film 56b is of long cycle, the surface of the resist film 57b formed on the semiconductor film 56b also has the convex and concave corresponding to those on the semiconductor film 56b, so that even if etching is performed using the surface 572 of the resist film 57b as a reference plane, a planar surface can not be obtained.

As a method for reducing the above-described surface irregularity, polishing method may be applicable. Especially, so-called rigid body polishing method using rigid body such as $SiO_2$ as a surface plate without a polishing pad may be suitable. However, as the thickness of the semiconductor film on an insulating film is originally about no more than 0.55 $\mu$m, polishing it intactly by the rigid body polishing method makes the surface rough, so that a uniform and plane surface can not be obtained.

Figure 12:
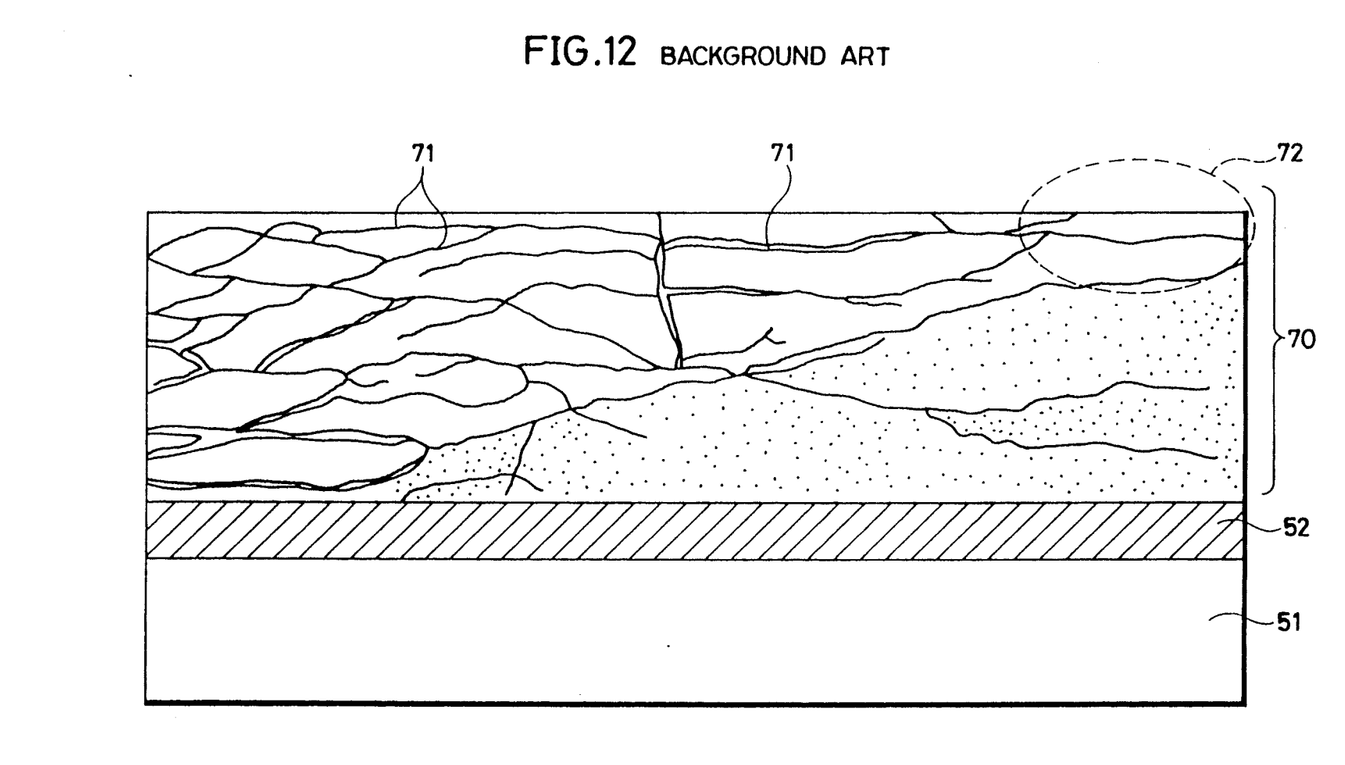
FIG. 12 is a diagram showing the surface condition in case where the single crystal semiconductor film obtained by the semiconductor device manufacturing method which is the background of this invention is polished intactly.

A section and plan view of a surface of a sample after polished are shown in FIG. 12. In FIG. 12, a number of scratches 71 are formed in the surface region 70 on the insulating film 52. In the region 72, the semiconductor film is absent. The surface becomes rough as shown in FIG. 12 because the semiconductor film is so thin that it is peeled off in polishing. As a method of forming a single crystal semiconductor film on an insulating film, as described above, the laser recrystallization method is employed when it is applied to implementing three dimensional elements. In this case, it is most suitable to obtain a crystal film with thickness of about 0.55 $\mu$m by recrystallization. It is difficult to obtain good crystals when it thicker or thinner. Therefore it is difficult to have a thick semiconductor film.

SUMMARY OF THE INVENTION

An object of the present invention is to provide a planarization method of a semiconductor film having irregularity.

Another object of the present invention is to provide a method of manufacturing a semiconductor device with reduced surface irregularity of a single crystal semiconductor film on an insulator.

According to the present invention, a film which is a machining allowance for polishing is formed on a semiconductor film having irregularities to implement a multilayered structure. Next, at the machining allowance film, the multilayered structure is grinded until a smooth uniform surface is formed on the semiconductor film, and then the machining allowance film is entirely removed.

In accordance with another aspect of the invention, the semiconductor film comprises a single crystal semiconductor film and is formed by the melting recrystallization method using energy beam irradiation.

In accordance with a further aspect of the invention, a grinding step of the multilayered structure comprises urging a polishing pad in contact with the multilayered structure and rotating the polishing pad while maintaining the contact.

In accordance with a further aspect of the invention, the multilayered structure is formed on a wafer and the step of grinding comprises mounting the wafer to a supporting base with the multilayered structure facing to a rigid body surface plate, and polishing the multilayered structure with the rigid body surface plate against which the wafer is pushed by the supporting base.

According to a still further aspect of the invention, an insulating film is formed on a main surface of a semiconductor substrate or on a device formed on a main surface of a semiconductor substrate. Next, a noncrystal semiconductor film is formed on the insulating film. Next, anti-reflection films are formed on the noncrystal semiconductor film at predetermined intervals. Next, by directing energy beam onto the noncrystal semiconductor film to form a single crystal semiconductor film, a single crystal semiconductor film having different film thicknesses in a semiconductor region corresponding to an anti-reflection film and a semiconductor region in the vicinity thereof. Next, the anti-reflection film is removed. Next, a film to be a machining allowance for polishing is formed on the single crystal semiconductor film. Next, Polishing is applied to the surface of the machining allowance film until the surface irregularities are removed.

According to this invention, a machining allowance film for polishing is formed on the surface side of a semiconductor film having irregularity and the polishing is performed from this film side, so that even if irregularity which can not be planarized by etch back method exists, the irregularity can be reduced to implement a planar semiconductor film. Thus, it is possible to provide semiconductor elements in a semiconductor film with uniform performance.

In the so-called SOI (Silicon-On-Insulator) technique forming a single crystal semiconductor film on an insulating film, it is difficult to form a thick film by recrystallization to implement good crystals. On the other hand, by applying this invention, it is possible to thicken the apparent thickness to be polished so that a single crystal semiconductor film with uniform thickness having good crystal can be formed on an insulating film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
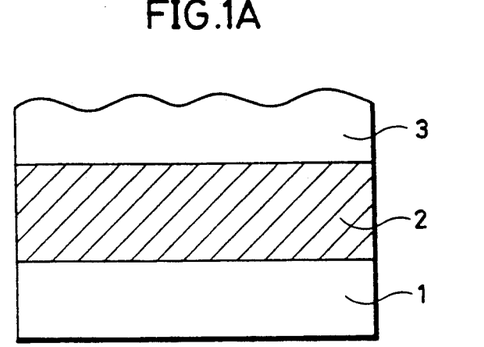
FIG. 1A-1C are sectional views showing in the sequence of steps a semiconductor device manufacturing method in accordance with one embodiment of this invention.

In FIG. 1A, a silicon oxide film 2 is formed on a silicon single crystal substrate 1, and a single crystal silicon film 3 is formed thereon. As the method of forming the single crystal silicon film 3 is the same as that shown in FIGS. 5A-5D and 6 described above, the description thereof is not repeated. FIG. 1A shows that the anti-reflection films used when the single crystal silicon film 3 is formed have already been removed. The irregularity appearing on the surface is enlarged in FIG. 1A. As the cause of the irregularity occurrence has been already described in the description corresponding to the above FIGS. 7-9, the description will not be repeated. In this embodiment, the thickness of the silicon oxide film 2 is 1-2 $\mu$m, and the thickness of the single crystal silicon film 3 is about 0.55 $\mu$m, and the surface irregularity is about ±0.06 $\mu$m as described above.

Figure 1B:
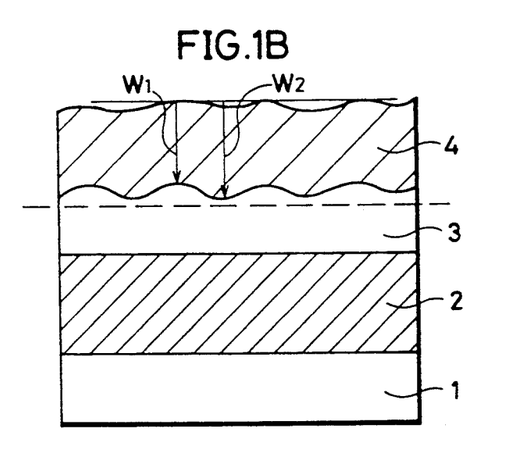

In FIG. 1B, a polysilicon film 4 is formed on the single crystal silicon film 3 described above, the polysilicon film 4 is formed by the CVD method, for example. The length W1 from the surface of the polysilicon film 4 to the convex portion of the single crystal silicon film 3 is more than 5000Å and the length W2 from the surface of the polisilicon film 4 to the concave portion of the single crystal film 3 is a value obtained by adding approximately 1000Å to W1. The thickness of the polysilicon film 4 is preferably about 0.5-1.0 $\mu$m, since it is enough for a machining allowance. However, if the polysilicon film thickness is larger than the value, there is no problem in surface planarization. While a polysilicon film is formed herein, it is not limited to the same. It is also preferable that substances having the same or similar polishing rate to that of a single crystal silicon are employed. In case where such substances are employed, a similar effect to that of polysilicon can be obtained. For example, an equivalent effect can be obtained by forming a thick single crystal silicon film 3 by epitaxial growth in place of the polysilicon film 4. However, as high temperature is required for causing the epitaxial growth, the method is not suitable in case where a device has been already formed under the insulating film 2 because a trouble may occur in the device due to the heat.

Figure 1C:
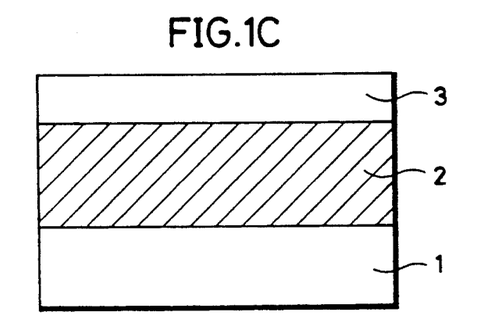

In FIG. 1C, the intermediate product shown in FIG. 1B was polished to a given depth (shown with the broken line in FIG. 1B) of the single crystal silicon film 3 from the polysilicon film 4 side. The thickness of the remaining single crystal film is preferably less than 4500Å. As shown in FIG. 1C, the surface of the single crystal silicon film 3 becomes a uniform and planar plane by the polishing.

Figure 2:
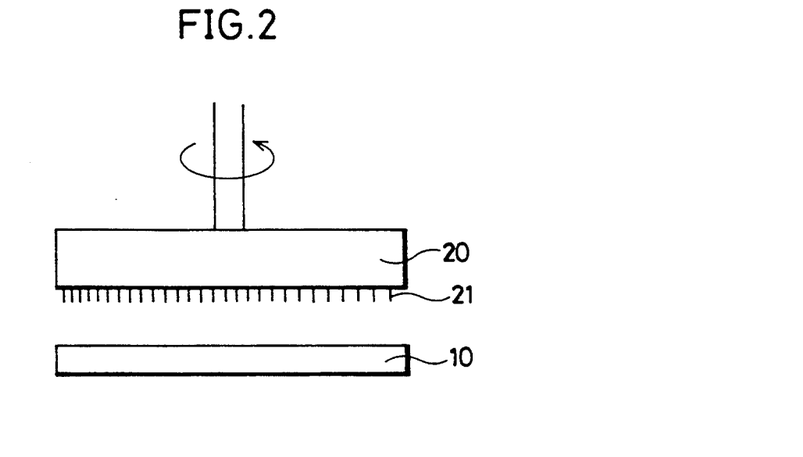
FIG. 2 is a view showing one specific polishing method employed to obtain the form shown in FIG. 1C from the form shown in FIG. 1B.
Figure 3:
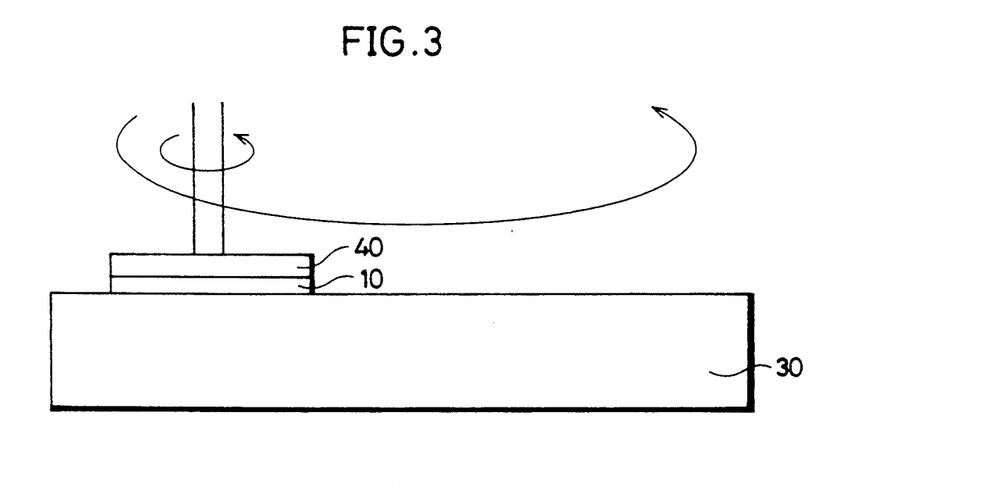
FIG. 3 is a view showing another specific polishing method employing to obtain the form shown in FIG. 1C from the form shown in FIG. 1B.

FIGS. 2 and 3 are diagrams showing the polishing methods employed in the embodiment, especially, FIG. 3 shows a rigid body polishing method. In FIG. 2, by pushing a polishing plate which includes a metal plate 20 and a polishing pad 21 provided thereon against a wafer 10 and rotating the same, a semiconductor film having surface irregularity formed on the wafer 10 is polished. In this case, as abrasive, glycerin or the like including alumina uniformly distributed is employed.

In FIG. 3, a surface plate 30 formed of a substance more difficult to be polished than silicon is employed.

The surface plate is formed of an silicon oxide, for example, and preferably of high purity quartz. If it is possible to prevent contamination to the single crystal semiconductor film in polishing, metal can be employed as a surface plate. The surface plate 30 is like a round plate, and linear trenches are formed in length and width directions on its main surface at intervals of 5 mm, for example. The width and the depth of the trenches are 1.5 mm and 1.0 mm, respectively, for example. The above-described trenches have a function for discharging polishing residue, a function for holding particulates included in a polishing solution which will be described later, and a function for spreading the polishing solution all over the surface plate. A rotatable supporting base 0 capable of moving parallel is provided in parallel with the main surface of the surface plate on such a surface plate 30. Wafer 10 is mounted on the supporting base 40 with its surface to be polished facing to the surface plate 30. Next, an alkaline solution of pH 10-11 in which 5 wt % of high purity silica with grain size of 0.02 $\mu$m is distributed is dropped to the surface plate 30. Next, wafer 10 is pushed to surface plate 30 with force of 100 g/cm$^2$, for example, and is rotated and revolved keeping in contact with surface plate 30. While wafer 10 is rotated, the above-described alkaline solution is continuously dropped. The alkaline solution has a function of etching a polysilicon film as a machining allowance and a single crystal silicon film to be made flat, and the silica particles has a function of grinding these films. In this way, the single crystal silicon film is made plane to implement a single crystal silicon film which is extremely smooth and has an even thickness on an insulating film. By the rigid body polishing method shown in FIG. 3, even if a substance having different polishing rate from that of the single crystal silicon film 3 is employed as the machining allowance film, good planarization of the single crystal silicon film can be obtained. However, to implement better planarization, a substance having the same or similar polishing rate as or to that of the single crystal silicon film is preferably used.

Figure 4:
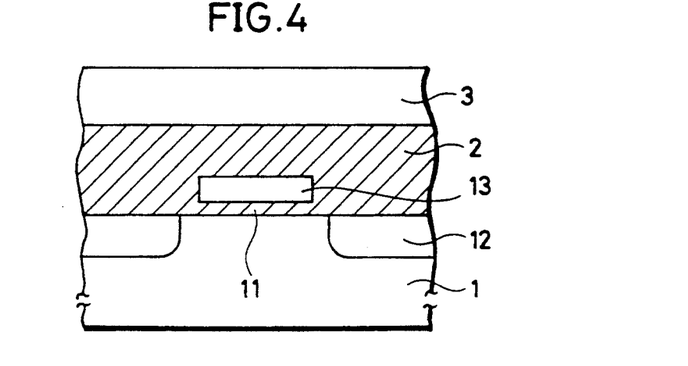
FIG. 4 is a sectional view showing a semiconductor device formed by the manufacturing method in accordance with this invention, on which semiconductor device an insulating film is formed and a planar single crystal semiconductor film is formed on the insulating film.

While a single crystal semiconductor film to be polished is formed on an insulating film in the above embodiment, the insulating film is not limited to one formed on a main surface of a semiconductor substrate, but may be one formed on a device. An example in which a single crystal semiconductor film is formed on an insulating film formed on a device is shown in FIG. 4. In FIG. 4, a gate insulating film 11 is formed on a semiconductor substrate 1, and a gate electrode 13 is formed on a gate insulating film 11. Impurity diffusion regions 12 are formed on the surface of the semiconductor substrate 1 by ion implantation using the gate electrode 13 as a mask. A transistor is composed of a semiconductor substrate surface defined by the impurity diffusion regions 12 to be source/drain, a gate insulating film 11 and a gate electrode 13 provided thereabove. The same effect can be obtained with respect to such a single crystal semiconductor film 3 formed on a device so that a planar, uniform and good single crystal semiconductor film can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of planarization of a semiconductor film of a thickness less than a machine allowance for polishing and having surface irregularities including concave portions and convex portions, comprising the steps of:
    forming a second film on said semiconductor film, filling said concave portions, to obtain a multilayered structure to provide a machining allowance for polishing, and
    polishing said multilayered structure at the surface of said second film until a smooth planar surface of uniform material is formed on said semiconductor film, said step of polishing comprising removing the entirety of said second film.

2. The method according to claim 1, wherein said semiconductor film comprises a single crystal semiconductor film and is formed on an insulating film.

3. The method according to claim 2, further comprising forming said single crystal semiconductor film by irradiating a semiconductor film with an energy beam to melt said semiconductor film and thereafter cooling said semiconductor film to permit recrystallization thereof.

4. The method according to claim 1, wherein said second film is formed of a material having a similar polishing rate to the polishing rate of said semiconductor film.

5. A method of manufacturing a semiconductor device as recited in claim 1, wherein said step of polishing comprises urging a polishing pad in contact with said multilayered structure and rotating said polishing pad while maintaining said contact.

6. The method of manufacturing a semiconductor device as recited in claim 5, wherein said step of polishing further comprises distributing an abrasive on the surface of said polishing pad.

7. The method of manufacturing a semiconductor device as recited in claim 1, wherein said multilayered structure is formed on a wafer and said step of polishing comprises mounting said wafer to a supporting base having a surface parallel to a surface of a rigid body surface plate with said multilayered structure facing to said rigid body surface plate and polishing said multilayered structure with said rigid body surface plate against which said wafer is pushed by said supporting base.

8. The method of manufacturing a semiconductor device as recited in claim 7, wherein said step of polishing further comprises supplying an alkaline solution including silica particulates distributed therein on the surface of said rigid body surface plate.

9. The method of manufacturing a semiconductor device as recited in claim 8, wherein said step of polishing further comprises etching the surface of said multilayered structure with said alkaline solution and grinding the same with said silica particulates.

10. A method of planarization of a semiconductor film of a thickness less than a machine allowance for polishing and having convex and concave portions on its surface, comprising the steps of:
    forming a second film on said semiconductor film for filling said concave portion to provide a multilayered structure with a thickness from said convex portion to a surface of said second film of W1 to provide a machining allowance for polishing, and a maximum thickness from said surface of said second film to said concave portion of said semiconductor film of W2, and
    polishing said multilayered structure at said surface of said second film so that the amount polished is of a thickness more than or equal to W2.

11. The method of planarization of a semiconductor film recited in claim 10, wherein said W1 is more than 5000Å and said W2 is a value obtained by adding approximately 1000Å to said W1.

12. The method of planarization of a semiconductor film according to claim 11, wherein a thickness of the remaining semiconductor film is less than 4500Å.

13. A method of manufacturing a semiconductor device, comprising the steps of:
    forming an insulating film on a semiconductor base member;
    forming a noncrystal semiconductor film on said insulating film;
    forming an anti-reflection film for preventing reflection of at predetermined intervals on said noncrystal semiconductor film;
    directing an energy beam onto said noncrystal semiconductor film to form a single crystal semiconductor film, said single crystal semiconductor film having different film thickness corresponding to said predetermined intervals to result in surface irregularities;
    removing said anti-reflection film;
    forming an additional film on said single crystal semiconductor film, covering said surface irregularities, to obtain a multilayered structure to provide machining allowance for polishing; and
    polishing at the surface of said additional film until a smooth planar surface of uniform material is formed and said surface irregularities are removed.

14. The method according to claim 13, wherein said semiconductor base member comprises a semiconductor substrate.

15. The method according to claim 13, wherein said semiconductor base member comprises a semiconductor substrate and a semiconductor device formed thereon.

16. A method of planarization of a semiconductor film having surface irregularities including concave portions and convex portions, comprising the steps of:

forming on said semiconductor film a second film on said semiconductor film of a material having a polishing rate similar to the polishing rate of said semiconductor film, filling said concave portions, to obtain a multilayered structure to provide a machining allowance for polishing, and polishing said multilayered structure at the surface of said second film until a smooth planar surface of uniform material is formed on said semiconductor film, said step of polishing comprising removing the entirety of said second film.

* * * * *